(12) United States Patent
Dong et al.

(10) Patent No.: US 8,451,032 B2
(45) Date of Patent: May 28, 2013

(54) CAPACITIVE ISOLATOR WITH SCHMITT TRIGGER

(75) Inventors: Zhiwei Dong, Austin, TX (US); Ka Y. Leung, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 80 days.

(21) Appl. No.: 12/976,020

(22) Filed: Dec. 22, 2010

(65) Prior Publication Data
US 2012/0161841 A1    Jun. 28, 2012

(51) Int. Cl.
*H03B 1/00* (2006.01)
*H03K 3/00* (2006.01)

(52) U.S. Cl.
USPC .................. 327/108; 327/111; 327/205

(58) Field of Classification Search
USPC .................... 327/108, 111, 205
See application file for complete search history.

(56) References Cited

U.S. PATENT DOCUMENTS

| | | | |
|---|---|---|---|
| 3,058,078 A | 10/1962 | Hoh | |
| 3,537,022 A | 10/1970 | Regan | |
| 3,713,148 A | 1/1973 | Cardullo et al. | |
| 3,714,540 A | 1/1973 | Galloway | |
| 3,760,198 A | 9/1973 | Mori et al. | |
| 3,798,608 A | 3/1974 | Huebner | |
| 3,859,624 A | 1/1975 | Kriofsky et al. | |
| 4,024,452 A | 5/1977 | Seidel | |
| 4,027,152 A | 5/1977 | Brown et al. | |
| 4,118,603 A | 10/1978 | Kumhyr | |
| 4,227,045 A | 10/1980 | Chelcun et al. | |
| 4,276,656 A | 6/1981 | Petryk | |
| 4,302,807 A | 11/1981 | Mentler | |
| 4,425,647 A | 1/1984 | Collins et al. | |
| 4,459,591 A | 7/1984 | Haubner et al. | |
| 4,523,128 A | 6/1985 | Stamm et al. | |
| 4,536,715 A | 8/1985 | Basarath et al. | |
| 4,538,136 A | 8/1985 | Drabing | |
| 4,547,961 A | 10/1985 | Bokil et al. | |
| 4,584,708 A | 4/1986 | Eilers et al. | |

(Continued)

FOREIGN PATENT DOCUMENTS

| | | |
|---|---|---|
| DE | 10100282 A1 | 7/2002 |
| FR | 2679670 A1 | 1/1993 |

(Continued)

OTHER PUBLICATIONS

"Publications—Geoff Walker", http://www.itee.uq.edu.au/~walkerg/publications/pubs_grw_links.html, downloaded May 2, 2007 (4 pages).

(Continued)

*Primary Examiner* — John Poos
(74) *Attorney, Agent, or Firm* — Abel Law Group, LLP

(57) ABSTRACT

High voltage isolation capabilities are provided using a first integrated circuit die that includes an inverting circuit path and a non-inverting circuit path coupled to receive a single-ended signal and to generate a differential signal from the single-ended signal for transmission over an isolation link. A second integrated circuit die includes a differential Schmitt trigger circuit coupled to the differential signal communicated over the isolation link and to supply at least one output signal corresponding thereto. An isolation barrier is disposed between the inverting and non-inverting circuit paths and the differential Schmitt trigger circuit and includes at least two isolation capacitors coupled to respectively transmit each portion of the differential signal.

23 Claims, 8 Drawing Sheets

U.S. PATENT DOCUMENTS

| | | |
|---|---|---|
| 4,650,981 A | 3/1987 | Foletta |
| 4,675,579 A | 6/1987 | Hardy et al. |
| 4,703,283 A | 10/1987 | Samuels |
| 4,710,922 A | 12/1987 | Scott |
| 4,748,419 A | 5/1988 | Somerville |
| 4,763,075 A | 8/1988 | Weigert |
| 4,780,795 A | 10/1988 | Meinel |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,853,654 A | 8/1989 | Sakurai |
| 4,859,877 A | 8/1989 | Cooperman et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,142,432 A | 8/1992 | Schneider |
| 5,164,621 A | 11/1992 | Miyamoto |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Kimura et al. |
| 5,424,709 A | 6/1995 | Tal |
| 5,434,886 A | 7/1995 | Kazawa et al. |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,544,120 A | 8/1996 | Kuwagata et al. |
| 5,555,421 A | 9/1996 | Enzinna |
| 5,572,179 A | 11/1996 | Ito et al. |
| 5,588,021 A | 12/1996 | Hunt et al. |
| 5,591,996 A | 1/1997 | Haigh et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,627,488 A | 5/1997 | Tanzawa et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabl |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglas |
| 5,789,960 A | 8/1998 | Bower |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham et al. |
| 5,831,426 A | 11/1998 | Black, Jr. et al. |
| 5,831,525 A | 11/1998 | Harvey |
| 5,845,190 A | 12/1998 | Bushue et al. |
| 5,850,436 A | 12/1998 | Rosen et al. |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 5,952,849 A | 9/1999 | Haigh |
| 5,969,590 A | 10/1999 | Gutierrez |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,082,744 A | 7/2000 | Allinger et al. |
| 6,087,882 A | 7/2000 | Chen et al. |
| 6,104,003 A | 8/2000 | Jones |
| 6,114,937 A | 9/2000 | Burghartz et al. |
| 6,124,756 A | 9/2000 | Yaklin et al. |
| 6,137,372 A | 10/2000 | Welland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,307,497 B1 | 10/2001 | Leung et al. |
| 6,384,763 B1 | 5/2002 | Leung et al. |
| 6,389,063 B1 | 5/2002 | Kanekawa et al. |
| 6,452,519 B1 | 9/2002 | Swanson |
| 6,525,566 B2 | 2/2003 | Haigh et al. |
| 6,538,136 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,720,816 B2 | 4/2004 | Strzalkowski |
| 6,728,320 B1 | 4/2004 | Khasnis et al. |
| 6,747,522 B2 | 6/2004 | Pietruszynski et al. |
| 6,757,381 B1 | 6/2004 | Worley |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,972,596 B1 | 12/2005 | Proebsting et al. |
| 6,977,522 B1 | 12/2005 | Murabayashi et al. |
| 7,012,388 B2 | 3/2006 | Lin et al. |
| 7,016,490 B2 | 3/2006 | Beutler et al. |
| 7,023,372 B1 | 4/2006 | Singh et al. |
| 7,053,807 B1 | 5/2006 | Gaalaas |
| 7,053,831 B2 | 5/2006 | Dempsey |
| 7,057,491 B2 | 6/2006 | Dempsey |
| 7,064,442 B1 | 6/2006 | Lane et al. |
| 7,075,329 B2 | 7/2006 | Chen et al. |
| 7,277,491 B2 | 10/2007 | Dong et al. |
| 7,315,592 B2 | 1/2008 | Tsatsanis et al. |
| 7,493,505 B2 | 2/2009 | Leung |
| 7,598,716 B2 | 10/2009 | Schlueter et al. |
| 7,755,400 B2 | 7/2010 | Jordanger et al. |
| 2003/0042571 A1 | 3/2003 | Chen et al. |
| 2005/0269657 A1 | 12/2005 | Dupuis |
| 2005/0271147 A1 | 12/2005 | Dupuis |
| 2005/0271148 A1 | 12/2005 | Dupuis |
| 2005/0271149 A1 | 12/2005 | Dupuis |
| 2005/0272378 A1 | 12/2005 | Dupuis |
| 2007/0126372 A1 | 6/2007 | Huang et al. |
| 2008/0018370 A1* | 1/2008 | Lee .................. 327/165 |
| 2008/0315925 A1 | 12/2008 | Alfano et al. |
| 2009/0017773 A1 | 1/2009 | Dupuis et al. |
| 2009/0213914 A1 | 8/2009 | Dong et al. |
| 2010/0327930 A1 | 12/2010 | Yan et al. |

FOREIGN PATENT DOCUMENTS

| | | |
|---|---|---|
| GB | 2173956 A1 | 10/1986 |
| JP | 198257-132460 A1 | 8/1982 |
| WO | US98122307 A1 | 4/1999 |

OTHER PUBLICATIONS

"A Tale of Two Modems," Sensors Magazine, Apr. 2002, pp. 30 and 32, http://archives.sensorsmag.com/articles/0402/26/.

Akiyama, Noboru, "A High-Voltage Monolithic Isolator for a Communication Network Interface," IEEE Transactions on Electron Devices, May 2002, pp. 895-901, vol. 49, No. 5, (7 pages).

Analog Devices- ADuM130x/ADuM140x: "Coupler Technology Removes the Limitations of Optocoupler Solutions," pp. 4-15, May 2003 (12 pages).

Baker, Bonnie C., "The Basics of Isolation Circuits," Sensors and Systems, May 1996, pp. 46-47 (2 pages).

Bindra, Ashok, "MEMS-Based Magnetic Coils Exceed the Limitations of Optical Couplers," Electronic Design, Jul. 24, 2000, p. 43.

Bourgeois, J.M., "PCB Based Transformer for Power MOSFET Drive," 0-7803-1456-5-94 at pp. 238-244, IEEE, 1994 (7 pages).

Choina, Simon, "Planar Transformers Make Maximum Use of Precious Board Space," Electronic Design, Mar. 9, 1999, pp. 97 & 99.

Clark, Ron and Underwood, Bob, "RS-232C/4221485 Line Isolation Solves More Than Fault Problems," EDN, Sep. 28, 1995, pp. 103-106, 108, 110, 112, 114-115 (9 pages).

"EDN'S 100 Top Products 1994," EDN, Dec. 8, 1994, pp. 58.

Green, M.W. et al., "Miniature Multilayer Spiral Inductors for GsAs MMICs," 1989 IEEE GaAs Symposium, 1989, pp. 303-306 (4 pages).

Hoskins, Kevin, "Isolated ADC Reduces Power Consumption," EDN, Mar. 30, 1995, pp. 73-74.

Aoki, Ichiro et al., "Fully Integrated CMOS Power Amplifier Design Using the Distributed Active-Transformer Architecture," IEEE Journal of Solid State Circuits, vol. 37, No. 3, Mar. 2002; pp. 371-373, 375-383 (12 pages).

IEEE Standard for a High Performance Serial Bus, IEEE Std. 1395-1995, Dec. 1995, pp. 1-392, NY.

"Impedance Matching Transformers," Transformer Applications, pp. 71-85, 2001 (15 pages).

Kester, Walt, Origins of Real-World Signals and Their Units Measurement, ch. 1, pp. 1.1-1.11, 2003.

Banerjee, Bhaskar and Kilger, Ronn, "Micromachined magnetics: a new step in the evolution of isolation technology," Electronic Engineering, Jun. 2000, pp. 27-32 (5 pages).

Klein, William P., "Applications of Signal Isolation," Sensors Magazine, Apr. 2000, pp. 70-74 (5 pages).

Knoedl Jr., G. et al., "A Monolithic Signal Isolator," IEEE, 1989, pp. 165-170 (6 pages).

Kojima, Yasuyuki et al., "A Novel Monolithic Isolator for a Communications Network Interface IC," 1998 Proceedings Annual IEEE International ASIC Conference, 1998, pp. 255-258 (12 pages).

Kojima, Yasuyuki et al., "2.3 kVac 100 MHz Multi-Channel Monolithic Isolator IC," 2000 Proceedings Annual IEEE International ASIC Conference, May 22-25, 2000, pp. 309-312 (4 pages).

Kuhn, William B. et al., "An RF-Based IEEE 1394 Ground Isolator Designed in a Silicon-on-Insulator Process," 44th IEEE 2001 Midwest Symposium on Circuits and Systems, Aug. 14-17, 2001, pp. 764-767 (5 pages).

Lam, Sam et al., "High-Isolation Bonding Pad Design for Silicon RFIC up to 20 GHz," IEEE Electron Device Letters, Sep. 2003, vol. 24, No. 5, pp. 601-603 (3 pages).

Long, John R. et al., "A 1.9 GHz Low-Voltage Silicon Bipolar Receiver Front-End for Wireless Personal Communications Systems," IEEE Journal of Solid-State Circuits, Dec. 1995, vol. 30, No. 12, pp. 1438-1448 (11 pages).

Long, John R., "Monolithic Transformers for Silicon RF IC Design," IEEE Journal of Solid-State Circuits, Sep. 2000, vol. 35, No. 9, pp. 1368-1382 (15 pages).

Mammano, Bob, Isolated Power Conversion: making the case for secondary-side control, EDN, Jun. 7, 2001, pp. 123-124, 126-127 (4 pages).

Martel, Jesus et al., "Analysis of a Microstrip Crossover Embedded in a Multilayered Anisotropic and Lossy Media," IEEE Transactions on Microwave Theory and Techniques, Mar. 1994, pp. 424-432, vol. 32, No. 3 (9 pages).

Munzer, M. et al., "Coreless transformer a new technology for half bridge driver IC's," 2000 (3 pages).

Pickering, Paul, "A System Designer's Guide to Isolation Devices," Sensors, Jan. 1999, (7 pages).

Ronkainen, H. et al., "IC compatible planar inductors on silicon," IEEE Proc.-Circuits Devices Syst., Feb. 1997, vol. 144, No. 1, pp. 29-35 (7 pages).

Schweber, Bill, "MEMS-Based Digital Isolator Answers Need for Extreme I/O Speed," EDN, Jul. 20, 2000, p. 24.

Schweber, Bill, "DAAs go for the Silicon," EDN, Feb. 17, 2000, (7 pages).

Simburger, Werner et al., "A Monolithic Transformer Coupled 5-W Silicon Power Amplifier with 59% PAE at .9Ghz," IEEE Journal of Solid-State Circuits, Dec. 1999, vol. 34, No. 12, pp. 1881-1892 (12 pages).

Sorenson, Jeff, "Direct-Access Arrangements Are Crucial to Successful Embedded-Modem Designs," Electronic Design, Aug. 20, 2001, (7 pages).

Stapleton, Helen and O'Grady, Albert, "Isolation Techniques for High-resolution Data-acquisition Systems," EDN, Feb. 1, 2000, (4 pages).

Tang, S.C. et al., "A Low-Profile Wide-Band Three-Port Isolation Amplifier with Coreless Printed-Circuit-Board (PCB) Transformers," IEEE Transactions on Industrial Electronics, Dec. 2001, vol. 48, No. 6, pp. 1180-1187 (8 pages).

Walker, Geoff and Ledwich, Garard, "An Isolated MOSFET Gate Driver," 1996 (6 pages).

Walker, Geoffry, "Modulation and Control of Multilevel Converters," Thesis submitted for Doctor of Philosophy (The University of Queensland), Nov. 16, 1999, pp. 1-202 (202 pages).

Titus, Ward S. And Kenney, John G., "10 GHz VCO for 0.13um CMOS Sonet CDR," Analog Devices, Jun. 2006 (4 pages).

Wolfs, P.J., "An Improved Transformer Coupled MOSFET/IGBT Driver," Journal of Electrical and Electronic Engineering, Australia—IE Aust. & IREE Aust., Sep. 1991, vol. 11, No. 3, pp. 197-200 (4 pages).

Young, Ron, "Feedback Isolation Augments Power-Supply Safety and Performance," EDN, Jun. 19, 1997, (4 pages).

Zhou, Jian-Jun and Allstot, David, "A Fully Integrated CMOS 900MHz LNA Utilitzing Monolithic Transformers," ISSCC Digest of Technical Papers, pp. 132-133, 1998.

Zhou, Jianjun and Allstot, David, "Monolithic Transformers and Their Application in a Differential CMOS RF Low-Noise Amplifier," IEEE Journal of Solid-State Circuits, Dec. 1998, pp. 2020-2027 (8 pages).

U.S. Appl. No. 12/494,621, filed Jun. 30, 2009, entitled "Schmitt Trigger With Gated Transition Level Control," Shouli Yan et al., inventors.

U.S. Appl. No. 12/551,788, filed Sep. 1, 2009, entitled "Low Power Voltage Regulator," Zhiwei Dong et al., inventors.

Yuan, Fei, "Differential CMOS Schmitt Trigger With Tunable Hysteresis," Analog Integr Circ Sig Process (2010), vol. 62:245-248, Springer, published online Aug. 13, 2009, 4 pages.

\* cited by examiner

CAPACITIVE ISOLATOR WITH SCHMITT TRIGGER

CROSS-REFERENCE TO RELATED APPLICATION(S)

This application relates to U.S. patent application Ser. No. 12/494,621, filed Jun. 30, 2009, entitled "Schmitt Trigger With Gated Transition Level Control"; U.S. patent application Ser. No. 12/414,379, filed on Mar. 30, 2009, entitled "Capacitive Isolation Circuitry"; U.S. patent application Ser. No. 12/060,049, filed on Mar. 31, 2008, entitled "Capacitive Isolator"; U.S. patent application Ser. No. 12/551,788, filed Sep. 1, 2009, entitled "Low Power Voltage Regulator"; and U.S. patent application Ser. No. 12/129,039, filed May 29, 2008, entitled "Isolator Circuit Including a Voltage Regulator"; all of which applications are incorporated herein by reference.

BACKGROUND

1. Field of the Invention

The present invention relates to isolators, and more particularly, to isolators using capacitive isolation techniques.

2. Description of the Related Art

There is a need for communication links that provide good isolation at a low cost. For example, typical digital links within power conversion products provide a short delay of less than 20 ns. Isolation between the input and output of power conversion products is typically in the range of 2,500-5,000 V. Existing solutions for providing isolation links include the use of magnetic pulse couplers, magnetic resistive couplers, capacitive couplers and optical couplers. Other isolation functions include control of high voltage circuitry. Improved methods for providing isolation over communication links, for use within, e.g., power supply components and other applications, would be desirable.

SUMMARY

In an embodiment an apparatus is provided that includes a differential Schmitt trigger circuit coupled to receive a differential signal communicated over an isolation link and to supply at least one output signal corresponding to the differential signal communicated over the isolation link.

In an embodiment the differential Schmitt trigger circuit includes a first transistor having a drain/source path coupled between a first output node and a first current source. A gate of the first transistor is coupled to receive a first portion of the differential signal. A second transistor has a drain/source path coupled between a second output node and the first current source. A gate of the second transistor is coupled to a second portion of the differential signal. A third transistor has a drain/source path coupled between the first output node and a second current source. The gate of the third transistor is coupled to the second output node. A fourth transistor has a drain/source path coupled between the second output node and the second current source and has a gate coupled to the first output node.

In an embodiment, the apparatus includes a transmit circuit on a transmit side of the isolation link, the transmit circuit includes an inverting circuit path and a non-inverting circuit path coupled to receive a single-ended signal and to generate a differential signal from the single-ended signal for transmission over the isolation link.

In an embodiment the apparatus further includes an oscillator circuit and a pulse generator circuit coupled to receive an output of the oscillator circuit and a single-ended signal. The pulse generator generates a pulse for transmission across the isolation link in response to a transition of the output of the oscillator circuit being separated from a transition on the single-ended signal by a predetermined amount of time.

In an embodiment the apparatus includes a transmit circuit on a transmit side of the isolation link. The transmit circuit includes an inverting circuit path and a non-inverting circuit path to generate from a single-ended signal a differential signal to be transmitted over the isolation link. An oscillator circuit supplies a clock signal to the inverting and non-inverting circuit paths in response to an input current.

In an embodiment a method is provided that includes receiving a differential signal transmitted over an isolation link at a differential Schmitt trigger circuit and supplying at least one output signal from the Schmitt trigger circuit corresponding to the differential signal.

The method may further include coupling the differential signal across the isolation link using at least a first and second isolation capacitor.

The method may further include generating a differential signal to be transmitted across the isolation link from a single-ended signal.

The method may further include generating a clock signal and generating a pulse signal for transmission across the isolation link when a transition of the clock signal is separated by a predetermined amount of time from a transition on an information signal to be communicated across the isolation link. The method may further include generating an exclusive OR of the pulse signal and the information signal and generating the differential signal therefrom for transmission across the isolation link.

The method may further include, on a transmit side of the isolation link, generating a clock signal in response to an input current and supplying the clock signal to an inverting circuit path and a non-inverting circuit path to generate a differential signal for transmission across the isolation link.

In another embodiment an isolation apparatus is provided that includes a first integrated circuit die having an inverting circuit path and a non-inverting circuit path coupled to receive a single-ended signal and to generate a differential signal from the single-ended signal for transmission over an isolation link. A second integrated circuit die includes a differential Schmitt trigger circuit coupled to receive the differential signal communicated over the isolation link and to supply at least one output signal corresponding thereto. The isolation link is coupled between the inverting circuit path and the differential Schmitt trigger circuit, and includes at least two isolation capacitors coupled to transmit respectively each portion of the differential signal and the two capacitors are disposed in one of the first and second integrated circuit dies.

BRIEF DESCRIPTION OF THE DRAWINGS

The present invention may be better understood, and its numerous objects, features, and advantages made apparent to those skilled in the art by referencing the accompanying drawings.

Note that the use of the same reference symbols in different drawings indicates similar or identical items.

DESCRIPTION OF THE PREFERRED EMBODIMENT(S)

Figure 1:
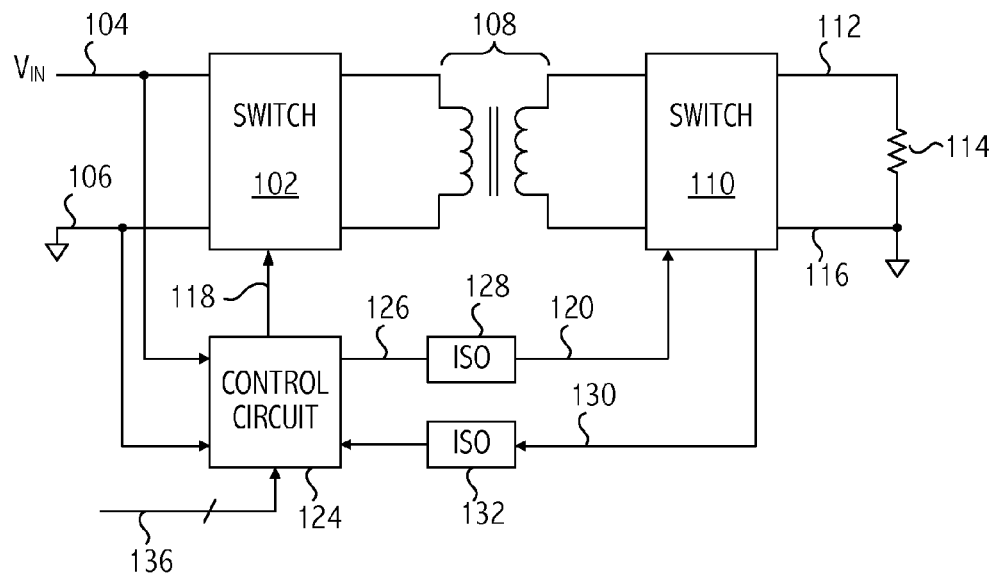
FIG. 1 illustrates an exemplary application for isolators described herein.

Referring to FIG. 1, shown is an exemplary application for isolation links described herein. FIG. 1 illustrates a block diagram of a DC-DC switching power supply utilizing capacitive isolation links. The illustrated power supply of FIG. 1 includes a primary switch group 102 that is operable to receive an input DC voltage on a node 104, and ground on a node 106. The primary switch group 102 is coupled through a transformer 108 to a secondary switch group 110. The secondary switch group 110 drives an output voltage node 112 that is connected to one terminal of a load 114, the secondary switch group 110 also having a ground connection on a node 116, the load 114 disposed between the node 112 and the node 116. The two switch groups 102 and 110 are operable to operate in conjunction with various pulse inputs on a control bus 118 associated with the primary switch group 102 and with various pulse inputs on a control bus 126 associated with the secondary switch group 110.

A digital control circuit 124 is provided for controlling the operation of the primary switch group 102 and the secondary switch group 110. The voltages on nodes 104 and 106 are provided as inputs to the digital control circuit 124 for sensing the voltage and current on the primary side, the digital control circuit 124 generating the information on the bus 118 for control of the primary switch group 102. The control circuit 124 must be isolated from the secondary group switch 110, since there can be a significant DC voltage difference therebetween. This is facilitated by driving the bus 126 through a capacitive isolation circuit 128, such as the capacitive isolation circuit which will be discussed herein below, to drive the bus 120. Similarly, the control circuit 124 is operable to sense the voltage and current levels on the output node 112 through sense lines 130 which are also connected through a capacitive isolation circuit 132 to the digital control circuit 124. The digital control circuit 124 also receives external control/configuration information on bus 136.

Figure 2:
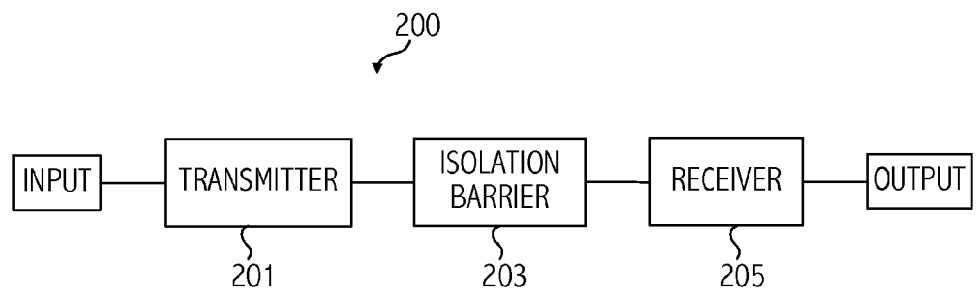
FIG. 2 illustrates an exemplary capacitive isolation link that may be used to provide the isolation links shown in FIG. 1.

Referring now to FIG. 2, there is illustrated a high level diagram of an exemplary capacitive isolation link that may be used to provide the isolation links shown in FIG. 1. The capacitive isolation link 200 of the present disclosure includes a transmitter portion 201, the isolation barrier 203, and a receiver 205 that receives information that has traversed the isolation barrier.

Figure 3:
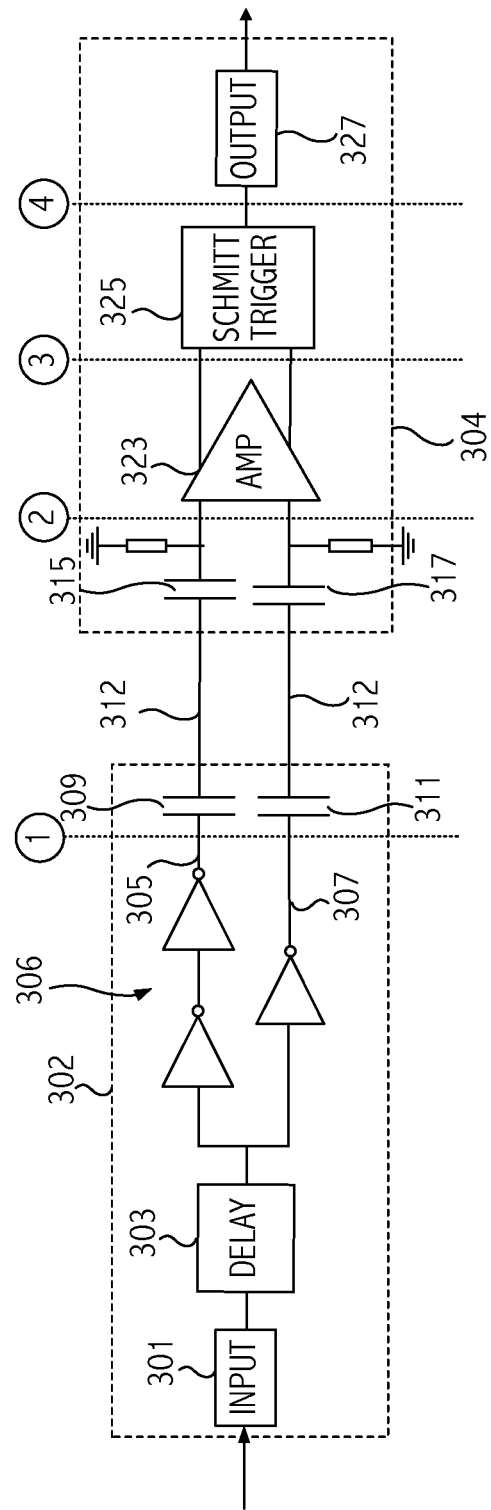
FIG. 3 illustrates additional details of the isolation link according to an embodiment of the invention.

An exemplary implementation of the isolation link is shown in more detail in FIG. 3. The transmit portion and the receive portion may be implemented in two integrated circuit dies 302 and 304 between which a data link with voltage isolation provides communication. An input signal received at input 301 is coupled to a delay block 303 (e.g., providing a 3 nanosecond delay). The delayed signal is supplied to inverters 306 to thereby provide an inverted signal 305 and a non-inverted signal 307 that are coupled to the isolation capacitors 309 and 311. The isolation capacitors may be respectively connected to another pair of isolation capacitors 315 and 317 in separate die 304. The capacitors may comprise, e.g., vertical, horizontal or finger capacitors. The isolation material may comprise silicon oxide or other isolation material. The isolation capacitors may range in an exemplary embodiment, e.g., from 18-35 femtoFarads. Other embodiments may utilize bigger or smaller capacitors.

On the receive side, the signals received at capacitors 315 and 317 are supplied to amplifier 323. The amplified signal is supplied to the Schmitt trigger circuit 325, which is described further herein, that decodes the received signal and supplies the received signal to the output 327.

Figure 4:
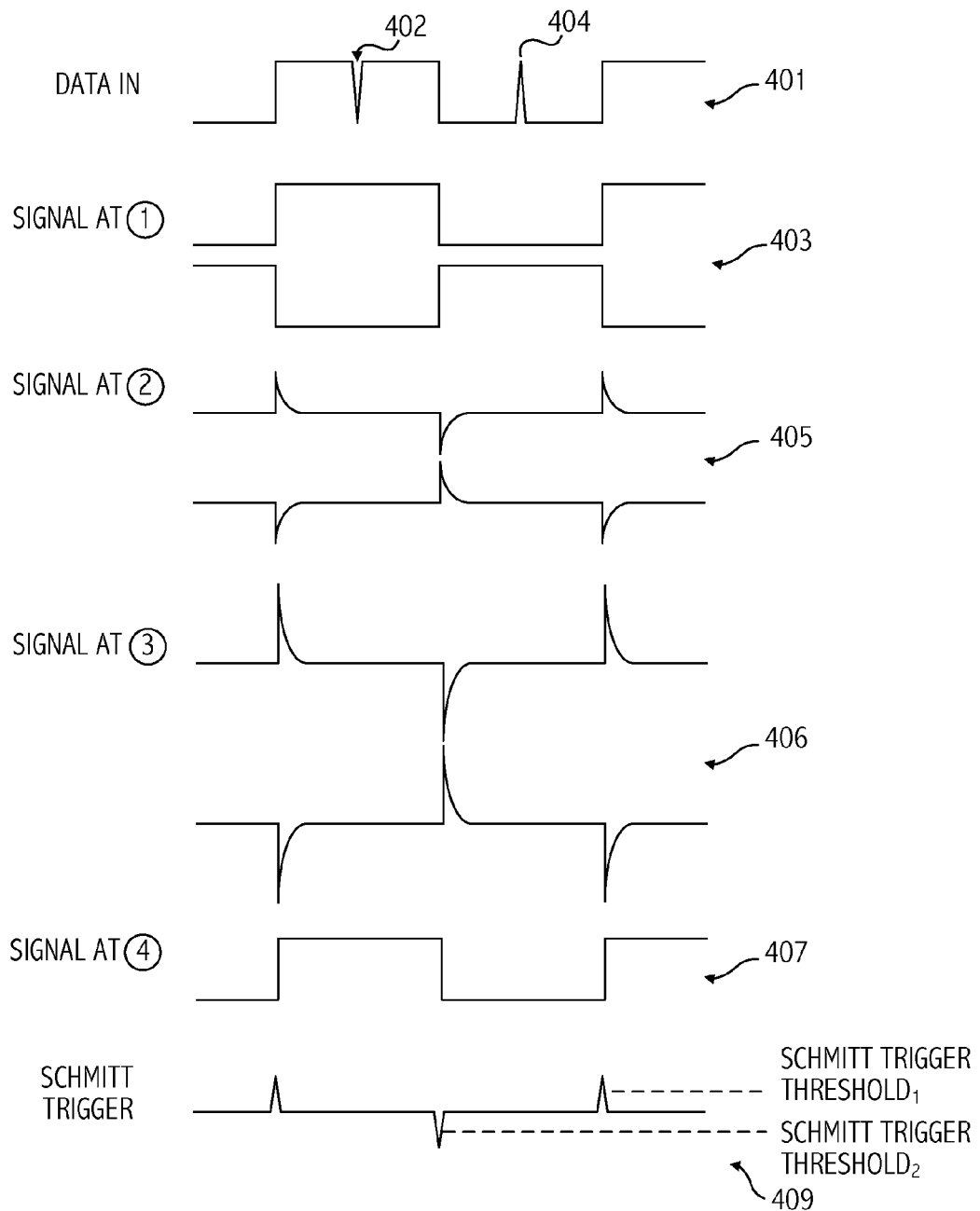
FIG. 4 shows timing diagrams that illustrate operation of the isolation link shown in FIG. 3.

Referring to FIG. 4, the timing diagrams illustrate operation of the isolator shown in FIG. 3. The data received shown in waveform 401 is serially transmitted from transmit circuitry to the receive circuitry. The signal after the creation of a differential signal is shown at 403. The data is transmitted across the isolation barrier by driving a differential signal across the isolation capacitors 309 and 311 such that energy is coupled across the capacitors. This will allow energy to be transmitted on transmission lines 312 that couple the capacitors 309 to 315 and 311 to 317. A first plate of capacitors 309 and 311 are associated with the input signal, and energy associated therewith is coupled across the high voltage isolation barrier created by the capacitor and onto the transmission lines 312 between the dies. The transmit and receive circuits may be fabricated on an integrated circuit utilizing conventional processing techniques and available conductive layers. Note that there will be a loss associated with the coupling coefficient across the capacitor such that the amount of energy that can be delivered from the transmit side to the receive side is reduced. The falling (rising) edge of the positive (negative) data shown in waveform 403 creates the negative and positive going pulses shown in waveform 405. The amplifier amplifies the signal as shown in waveform 406 to address to losses associated with transmission across the isolation barrier. The Schmitt trigger circuit is coupled to receive the differential input from the capacitors and provide the output signal shown at 407. As shown in waveform 409, the Schmitt trigger circuit 325 has two thresholds to determine the rising edge and the falling edge of the pulse as shown.

Figure 5:
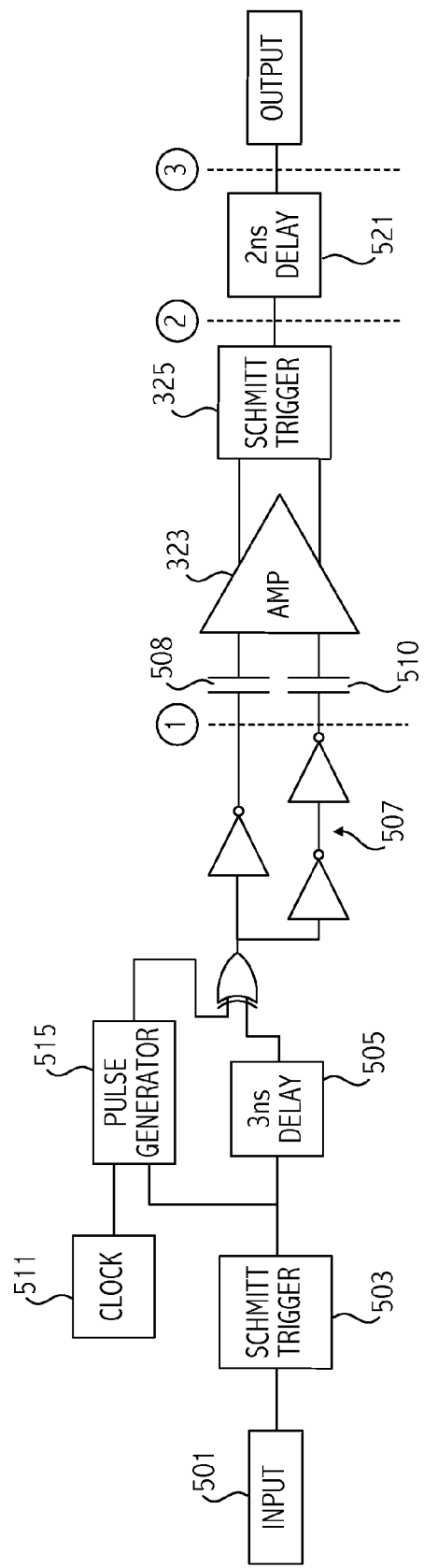
FIG. 5 illustrates another exemplary isolator according to an embodiment of the invention.

Referring to FIG. 5, an exemplary embodiment addresses a potential problem when a temporary power loss occurs on the output die side (the receive side). When power comes back to the circuit, the circuit will return to the default state, but that may be a problem in some applications as explained further herein. Referring to FIG. 5 an input signal is provided to input 501. A Schmitt trigger is used to clean up the input signal and supply its output to a delay block 505. The delay block 505 functions as a digital filter to filter out glitches, e.g., less than 3 ns, that may get injected after the Schmitt trigger circuit, such as shown at 402, 404 in FIG. 4. An exemplary Schmitt trigger circuit suitable for use in 503 is shown and described in U.S. patent application Ser. No. 12/494,621, filed Jun. 30, 2009, entitled "Schmitt Trigger With Gated Transition Level Control." The delay block supplies the inverters 507 that generate a differential (inverted and non-inverted) signal to couple to the isolation link. In an embodiment, a single pair of isolation capacitors 508 and 510 may be used, which may be located on either the transmit or the receive side. In addition, a clock 511 and pulse generator 515 supply a signal that can be transmitted across the link in the absence of an input signal on input 501. The clock frequency may range, e.g., from 300 KHz to 5 MHz (or greater or lesser) and depends on specific application requirements. The pulse generator 515 generates pulses based on the input signal and the clock signal. The pulses may be, e.g., 1 to 1.5 ns wide, but the width of the pulse can vary to be wider or narrower depending on application requirements.

Under normal working conditions, the pulse generator does not cause anything to be sent across the isolation link. However, if the input state is static for a predetermined period of time, such as 3 µs, the pulse generator causes a pulse to be transmitted across the isolation link.

Figure 6:
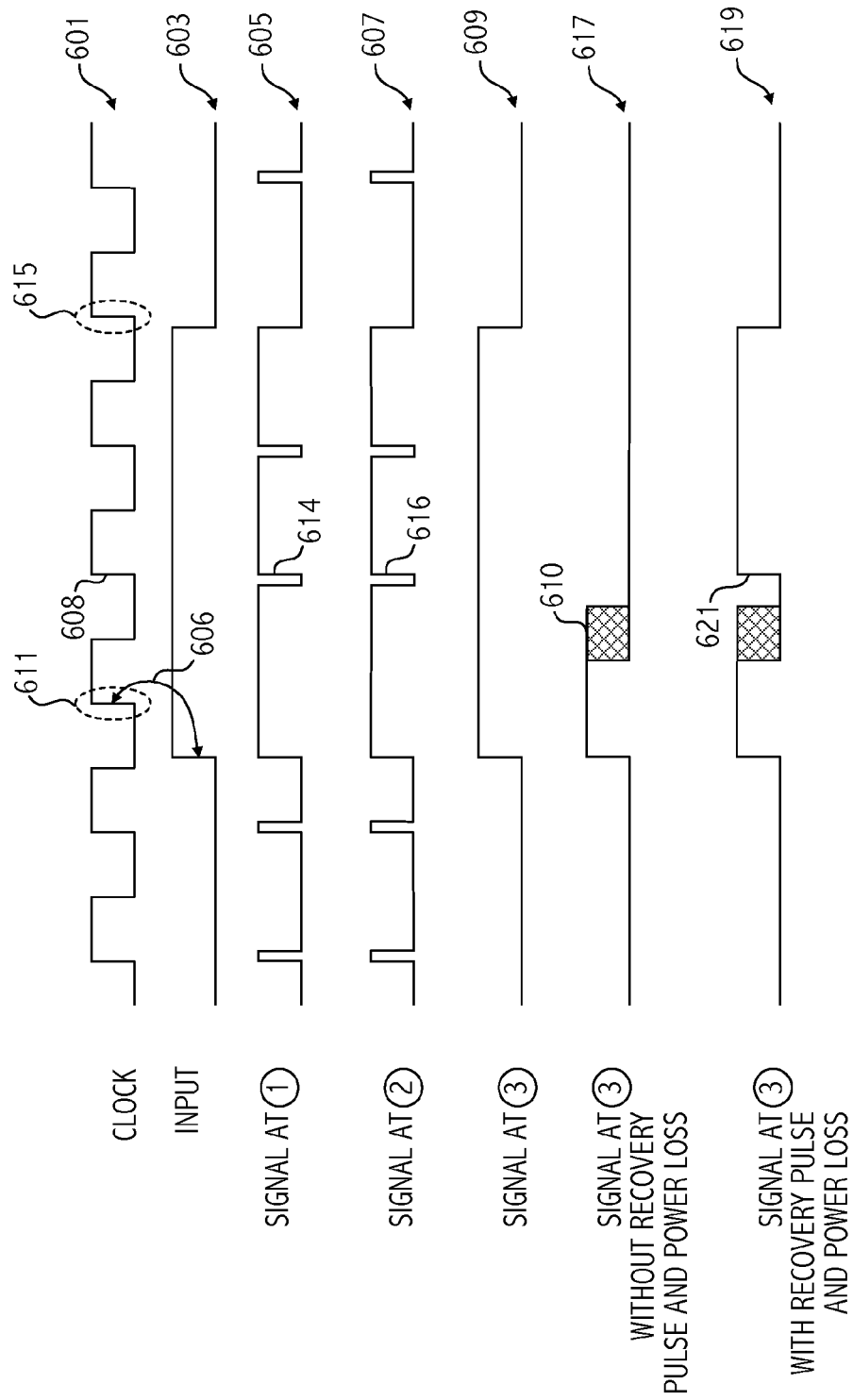
FIG. 6 shows waveforms at various places in the system of FIG. 5, illustrating operation of the system with the pulse generator.

FIG. 6 shows waveforms at various places in the system of FIG. 5, illustrating operation of the system with the pulse generator and the potential problem solved by the recovery pulse. The clock signal generated in oscillator 511 is shown at 601. The input signal is shown at 603. Pulses generated by the pulse generator are shown at 605. The first two pulses shown in waveforms 605 and 607 (at different ends of the isolation link) occur because the distance between them is more than the exemplary predetermined time period of 3 µs. Note that those pulses are filtered out by the 2 ns delay filter 521.

A transition (rising edge) occurs on the input signal. When a clock edge occurs that is within 3 µs of a transition on the input signal, e.g., at 606, the pulse is suppressed by the pulse generator. Thus, e.g., the clock edge occurring at 611, within the predetermined time of the input transition, does not generate a pulse that is transmitted across the link. However, the next rising clock edge at 608 results in a pulse across the link at 614. Note that the pulse is an XOR function with the static value of the input signal. Similarly, the clock rising edge at 615 does not result in a pulse on the isolation link because it occurs within the predetermined time period of the falling edge of the input signal.

FIG. 6 illustrates a potential problem and a solution for some applications such as power applications where the output signal has to follow the input signal. Assume a power loss occurs on the output side at 610. When the output side recovers power, without the help of a recovery pulse the output side resets to an initial state where it outputs a zero as shown at waveform 617. However, with a zero on the output side and a one on the input side, the output is no longer tracking the input. Utilizing the recovery pulse solves the problem as shown in waveform 619. The recovery pulse at 614 results in a pulse 616 as shown in waveform 607. That in turn results in the output returning to tracking the input side at 621, as shown in waveform 619, following the rising edge of pulse 616 and after the delay in delay filter 521 (FIG. 5). Thus, even with a power loss on the output side, the output side returns to track the input side within a 3 µs time period or less by using the recovery pulse. In addition to allowing the output to recover and track the input, the periodic pulses also allow the output side to determine whether the input side has suffered a power loss or for some other reason is no longer sending control information, which allows the output side to enter a reset state, if such a condition is detected.

Figure 7:
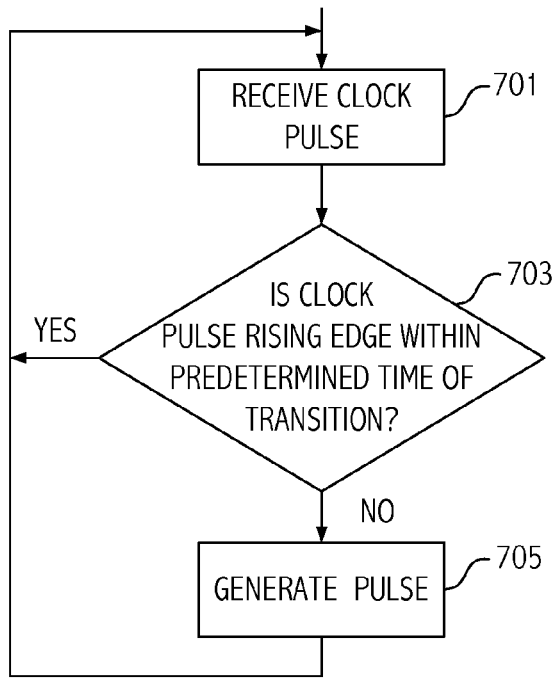
FIG. 7 illustrates a high level flow diagram of the functioning of the pulse generator.

FIG. 7 illustrates a high level operation of the pulse generator. At 701, the pulse generator receives a rising edge of the clock signal. At 703, the pulse generator determines whether that rising edge is within the specified predetermined time period of a transition of the input signal, which is supplied to the pulse generator 515 from the Schmitt trigger circuit 503. That may be accomplished using a counter that is triggered by an edge of the input signal. If the rising clock edge is not within the predetermined time period (counter expired), then a pulse of appropriate width is generated and the pulse generator returns to 701 to await the next clock edge.

Figure 8:
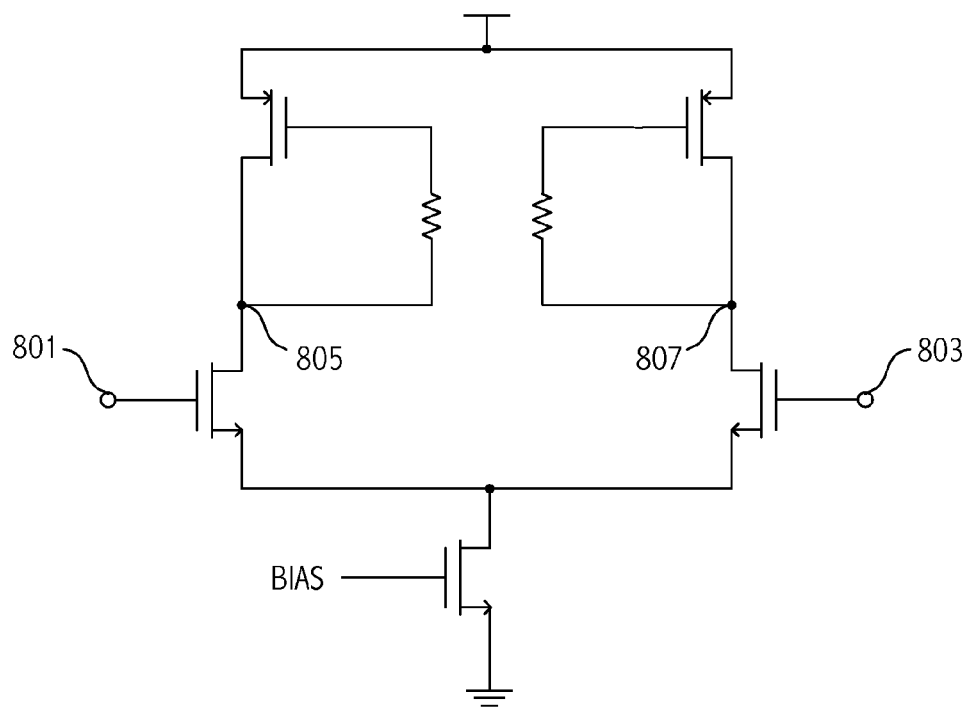
FIG. 8 illustrates an exemplary amplifier that may be used to amplify the differential signal received on the isolation link.

On the receive side, as shown in FIGS. 3 and 5, an amplifier 323 amplifies the differential signal received across the isolation barrier and supplies the amplified signal to the Schmitt trigger circuit 325. An exemplary amplifier is illustrated in FIG. 8 that shows the positive input from the isolation link being supplied on node 801 and the negative input being supplied on node 803. The amplified differential output is provided on nodes 805 and 807. In an embodiment, the desired gain of the amplifier is approximately 20 dB. Other amplifier implementations may of course be used according to the amplification requirements of the particular system. In fact, in one preferred implementation, isolation capacitors are utilized on only one side of the isolation link and the loss through the isolation link is small enough to significantly reduce the amplification requirements or even avoid the need for a receive amplifier completely.

The output of the amplifier, if the amplifier is required, is supplied to differential Schmitt trigger circuit 325 used for controlling hysteresis. When the input value is higher than a first chosen threshold, the output of the Schmitt trigger goes high. Similarly, when the input is below a second lower threshold level, the output goes to a logical "low" level. When the input remains between the high and low threshold levels, the output retains its current value. A Schmitt trigger provides greater stability than a circuit input including only a single input threshold level.

Figure 9:
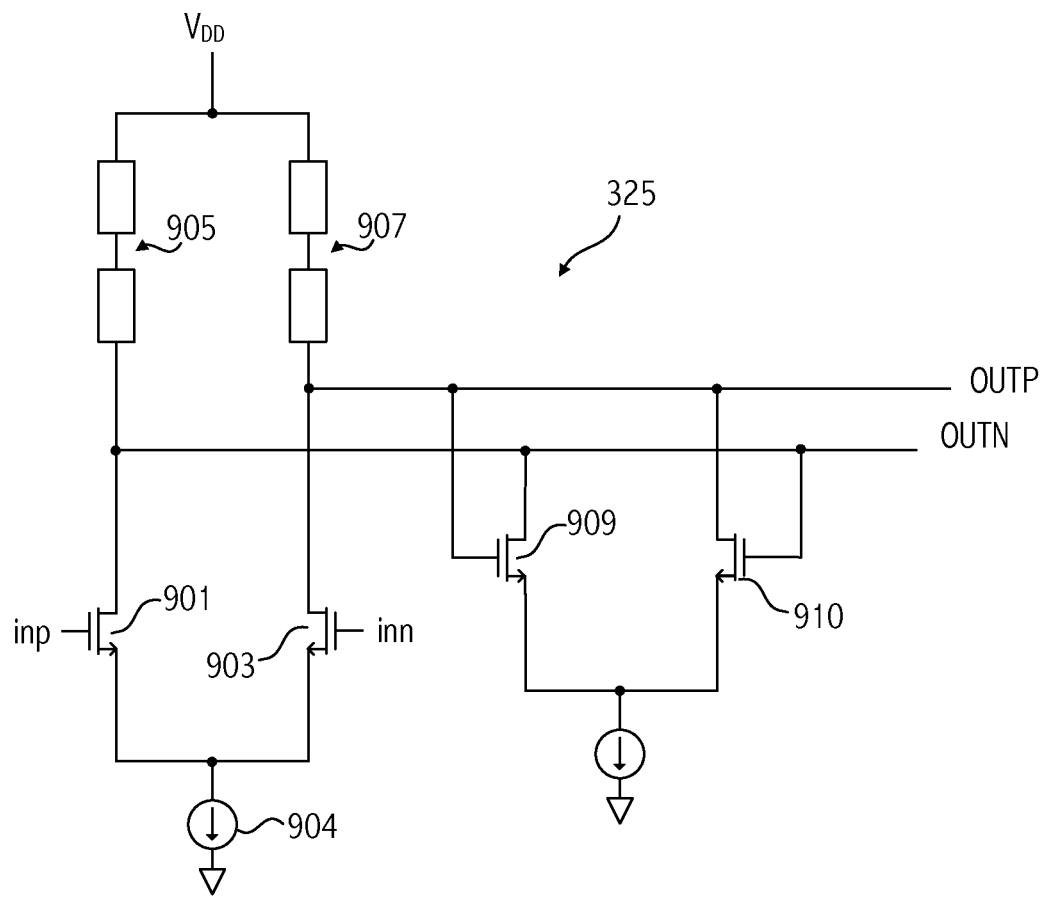
FIG. 9 illustrates an exemplary embodiment of a differential Schmitt trigger circuit that may be used on the receive side.

FIG. 9 illustrates an exemplary embodiment of a differential Schmitt trigger circuit that may be used as differential Schmitt trigger circuit 325. The positive and negative differential inputs are provided respectively to the gates of transistors 901 and 903. Transistors 901 and 903 have their drain/source path coupled between loads 905 and 907 and current source 904. Hysteresis for the positive and negative going pulses is provided by transistors 909 and 910 so that voltage values beyond the thresholds set by transistors are required in order to change the output. In an exemplary embodiment, the desired hysteresis is 150 mV for the positive threshold and −150 mV for the negative threshold. While the output is shown as differential, other embodiments may utilize a single-ended output. The use of the Schmitt trigger to detect the signal transmitted on the isolation link allows the gain of the amplifier to be lower, reduces the power and complexity of the receiver, improves jitter performance and channel-to-channel match for the isolation link. In an exemplary embodiment, the amplifier gain is lowered by 15 dB, power is reduced by 50%, jitter performance is improved by a factor of 3, and channel-to-channel match is improved by 50%.

The receive side may utilize a significantly higher voltage than the transmit side. One way to reduce the power supply of the receive side is described in U.S. patent application Ser. No. 12/551,788, filed Sep. 1, 2009, entitled "Low Power Voltage Regulator", which is incorporated by reference herein.

Figure 10:
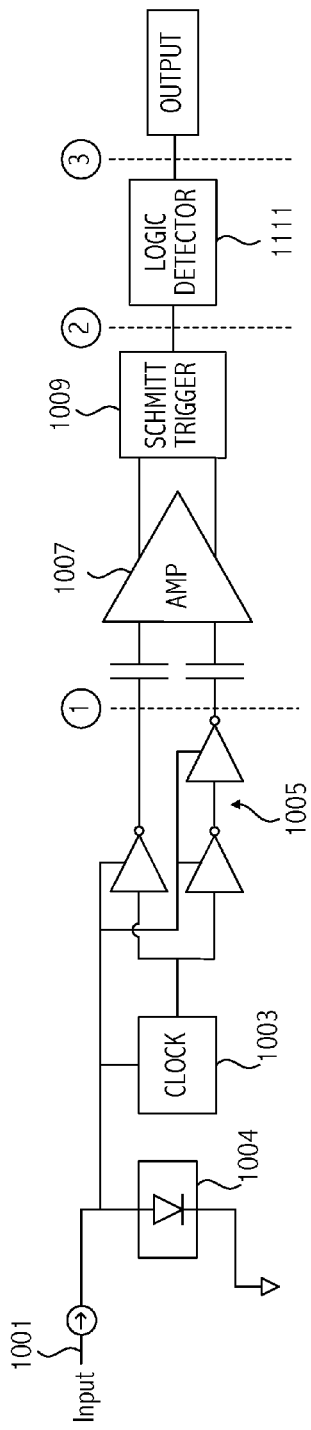
FIG. 10 illustrates another embodiment of an isolation link that utilizes a Schmitt trigger circuit on the receive side of the isolation link.
Figure 11:
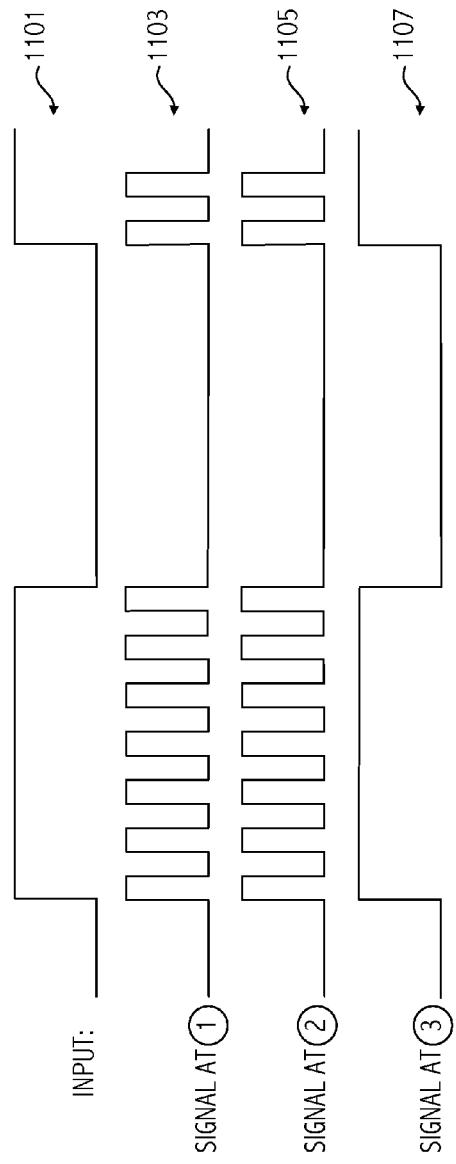
FIG. 11 shows timing diagrams illustrating operation of the system shown in FIG. 10.

Referring now to FIG. 10, another embodiment of an isolation link is illustrated that utilizes the Schmitt trigger circuit on the receive side of the isolation link. The embodiment includes a current input 1001 that when on, causes a corresponding transmission across the capacitive isolation link. The current provides the power source for the components, clock 1003 and the inverter circuits 1005. FIG. 11 shows timing diagrams illustrating operation of the system shown in FIG. 10. The input current is shown at 1101. The input current through diode 1004 creates a voltage that is used as the supply voltage. The oscillator circuit 1003, which may be a ring oscillator, an LC oscillator or any suitable oscillator circuit, generates the waveform shown at 1103. Note that only the positive waveform of the differential signal supplied across the isolation link is illustrated in FIG. 3. When the current stops, the clock signal stops and transmission across the isolation link also stops as power for the transmit components also stops. The received signal is received by the amplifier 1007, which in turns supplies the amplified signal to the Schmitt trigger circuit 1009. Both the amplifier and Schmitt trigger circuit may be implemented as previously described. The Schmitt trigger circuit supplies the oscillating signal to a detector circuit that supplies the output signal shown as waveform 1107. The detector circuit may utilize a counter that determines a logical zero output if no transitions occur within a predetermined time period and otherwise outputs a logical high. Additional details on embodiments that can be used to generate the supply voltage on the transmit side using the supplied current can be found in U.S. patent application Ser. No. 12/129,039, filed May 29, 2008, entitled "Isolator Circuit Including a Voltage Regulator", which application is incorporated herein by reference.

It will be appreciated by those skilled in the art having the benefit of this disclosure that the capacitive isolator embodiments described herein provide a voltage isolator link. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An apparatus comprising:
   a differential Schmitt trigger circuit coupled to an isolation link and coupled to supply at least one output signal corresponding to a differential signal communicated over the isolation link;
   wherein the differential signal received by the differential Schmitt trigger comprises pulses corresponding to transitions of the differential signal prior to being transmitted over the isolation link.

2. The apparatus as recited in claim 1 wherein the differential Schmitt trigger circuit comprises:
   a first transistor having a drain/source path coupled between a first output node and a first current source, a gate of the first transistor coupled to receive a first portion of the differential signal;
   a second transistor having a drain/source path coupled between a second output node and the first current source, a gate of the second transistor coupled to a second portion of the differential signal;
   a third transistor having a drain/source path coupled between the first output node and a second current source, a gate of the third transistor coupled to the second output node; and
   a fourth transistor having a drain/source path coupled between the second output node and the second current source, a gate of the fourth transistor coupled to the first output node.

3. The apparatus as recited in claim 1 further comprising a transmit circuit on a transmit side of the isolation link, the transmit circuit comprising:
   an inverting circuit path and a non-inverting circuit path coupled to receive a single-ended signal and to generate the differential signal from the single-ended signal for transmission over the isolation link.

4. The apparatus as recited in claim 3 further comprising:
   an oscillator circuit; and
   a pulse generator circuit coupled to receive an output of the oscillator circuit and the single-ended signal, the pulse generator to generate a pulse for transmission across the isolation link in response to a transition of the output of the oscillator circuit being separated from a transition of the single-ended signal by a predetermined amount of time.

5. The apparatus as recited in claim 3 further comprising;
   a second Schmitt trigger circuit coupled to the single-ended signal and coupled to supply the single-ended signal to the inverting circuit path and the non-inverting circuit path.

6. The apparatus as recited in claim 3 further comprising a first pair of isolation capacitors in an integrated circuit die in which the inverting circuit path and the non-inverting circuit path are disposed.

7. The apparatus as recited in claim 6 wherein the first pair of isolation capacitors are coupled to supply the Schmitt trigger circuit with the transmitted differential signal without amplification on the receive side.

8. An apparatus comprising:
   a differential Schmitt trigger circuit coupled to an isolation link and coupled to supply at least one output signal corresponding to a differential signal communicated over the isolation link; and
   an amplifier circuit disposed between the isolation link and the Schmitt trigger circuit to amplify the differential signal communicated over the isolation link and supply the amplified differential signal to the Schmitt trigger circuit.

9. An apparatus comprising:
   a transmit circuit on a transmit side of an isolation link, the transmit circuit comprising:
      an inverting circuit path and a non-inverting circuit path to generate from a single-ended signal a differential signal to be transmitted over the isolation link; and
      an oscillator circuit coupled to supply a clock signal to the inverting and non-inverting circuit paths in response to an input current; and
   a receive circuit on a receive side of the isolation link, the receive circuit including a differential Schmitt trigger circuit to supply at least one output signal corresponding to the differential signal communicated over the isolation link.

10. The apparatus as recited in claim 9 further comprising:
    a decoder circuit coupled to the output of the Schmitt trigger circuit to decode as a first value presence of the clock signal in the output of the Schmitt trigger circuit and to decode as a second value absence of the clock signal from the output of the Schmitt trigger circuit.

11. A method comprising:
    supplying a differential signal transmitted over an isolation link to a differential Schmitt trigger circuit; and
    generating at least one output signal from the differential Schmitt trigger circuit corresponding to the differential signal;
    wherein the differential signal received by the differential Schmitt trigger comprises a pulse corresponding to a transition of the differential signal present on the differential signal prior to transmission across the isolation link.

12. The method as recited in claim 11 further comprising coupling the differential signal across the isolation link using at least a first and second isolation capacitor.

13. The method as recited in claim 11 further comprising:
generating the differential signal to be transmitted across the isolation link from a single-ended signal.

14. The method as recited in claim 13 further comprising:
generating a clock signal; and
generating the pulse for transmission across the isolation link when a transition of the clock signal is separated by a predetermined amount of time from a transition of an information signal to be communicated across the isolation link.

15. The method as recited in claim 14 further comprising:
generating an exclusive OR of the pulse and the information signal; and
generating the differential signal therefrom for transmission across the isolation link.

16. The method as recited in claim 14 further comprising;
supplying the information signal to a second Schmitt trigger circuit, which is coupled to supply the single-ended signal to the inverting path and non-inverting path.

17. A method comprising:
supplying a differential signal transmitted over an isolation link to a differential Schmitt trigger circuit;
amplifying the differential signal before supplying the differential signal to a differential Schmitt trigger circuit; and
generating at least one output signal from the differential Schmitt trigger circuit corresponding to the differential signal.

18. A method comprising:
on a transmit side of an isolation link, generating a clock signal in response to an input current;
supplying the clock signal to an inverting circuit path and a non-inverting circuit path to generate a differential signal;
supplying a differential signal transmitted over an isolation link to a differential Schmitt trigger circuit; and
generating at least one output signal from the differential Schmitt trigger circuit corresponding to the differential signal.

19. The method as recited in claim 18 further comprising:
supplying the output signal of the Schmitt trigger circuit to a decoder circuit;
decoding presence of the clock signal in the output of the Schmitt trigger circuit as a first value; and
decoding absence of the clock signal in the output of the Schmitt trigger circuit for a predetermined period of time as a second value.

20. An isolation apparatus comprising:
a first integrated circuit die including,
  a pulse generator to generate output pulses in accordance with a clock signal, the pulse generator operable to suppress an output pulse if an input signal transitions within a predetermined time period before the clock signal; and
  a logical function coupled to combine the output pulses with the input signal and to supply the output pulses logically combined with the input signal as a single-ended signal;
  an inverting circuit path and a non-inverting circuit path coupled to receive the single-ended signal and to generate a differential signal from the single-ended signal for transmission over an isolation barrier;
a second integrated circuit die including,
  a differential Schmitt trigger circuit coupled to receive the differential signal communicated over the isolation link and to supply at least one output signal corresponding thereto; and
the isolation barrier coupled between the inverting and the non-inverting circuit paths and the differential Schmitt trigger circuit, including at least two isolation capacitors, one for each portion of the differential signal, the isolation capacitors being disposed in at least one of the first and second integrated circuit dies.

21. The apparatus as recited in claim 20 wherein the first integrated circuit die further comprises a first delay circuit coupled to receive the input signal and supply a delayed input signal to the logical function with a first delay, the first delay being longer than a width of the output pulses.

22. The apparatus as recited in claim 21 wherein the second integrated circuit die further comprises a second delay circuit coupled to the differential Schmitt trigger circuit, the second delay circuit having a second delay to filter out the output pulses from the at least one output signal.

23. The apparatus as recited in claim 22 wherein the second delay and first delay are independent.

* * * * *